(12) United States Patent
Whig et al.

(10) Patent No.: US 10,276,789 B2
(45) Date of Patent: *Apr. 30, 2019

(54) METHODS OF MANUFACTURING A MAGNETIC FIELD SENSOR

(71) Applicant: EVERSPIN TECHNOLOGIES, INC., Chandler, AZ (US)

(72) Inventors: Renu Whig, Chandler, AZ (US); Phillip Mather, Phoenix, AZ (US); Kenneth Smith, Chandler, AZ (US); Sanjeev Aggarwal, Scottsdale, AZ (US); Jon Slaughter, Albany, NY (US); Nicholas Rizzo, Gilbert, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 15/860,914

(22) Filed: Jan. 3, 2018

(65) Prior Publication Data

US 2018/0130944 A1   May 10, 2018

Related U.S. Application Data

(60) Continuation of application No. 15/388,650, filed on Dec. 22, 2016, now Pat. No. 9,893,274, which is a
(Continued)

(51) Int. Cl.
| | |
|---|---|
| *H01L 43/12* | (2006.01) |
| *B82Y 25/00* | (2011.01) |

(Continued)

(52) U.S. Cl.
CPC .............. *H01L 43/12* (2013.01); *B82Y 25/00* (2013.01); *G01R 33/0052* (2013.01);
(Continued)

(58) Field of Classification Search
None
See application file for complete search history.

(56) References Cited

U.S. PATENT DOCUMENTS

| | | |
|---|---|---|
| 4,566,050 A | 1/1986 | Beam et al. |
| 5,247,278 A | 9/1993 | Pant et al. |
| | (Continued) | |

FOREIGN PATENT DOCUMENTS

| | | |
|---|---|---|
| CN | 1726561 A | 1/2006 |
| CN | 101203769 A | 6/2008 |
| | (Continued) | |

OTHER PUBLICATIONS

U.S. Appl. No. 12/433,679, filed Apr. 30, 2009.
(Continued)

*Primary Examiner* — Michelle Mandala
(74) *Attorney, Agent, or Firm* — Bookoff McAndrews, PLLC

(57) ABSTRACT

A semiconductor process integrates three bridge circuits, each include magnetoresistive sensors coupled as a Wheatstone bridge on a single chip to sense a magnetic field in three orthogonal directions. The process includes various deposition and etch steps forming the magnetoresistive sensors and a plurality of flux guides on one of the three bridge circuits for transferring a "Z" axis magnetic field onto sensors orientated in the XY plane.

22 Claims, 11 Drawing Sheets

Related U.S. Application Data continuation of application No. 15/145,515, filed on May 3, 2016, now Pat. No. 9,553,261, which is a continuation of application No. 14/954,075, filed on Nov. 30, 2015, now Pat. No. 9,362,491, which is a continuation of application No. 13/972,637, filed on Aug. 21, 2013, now Pat. No. 9,269,891, which is a division of application No. 12/751,927, filed on Mar. 31, 2010, now Pat. No. 8,518,734.

(51) Int. Cl.
| | |
|---|---|
| G01R 33/00 | (2006.01) |
| G01R 33/09 | (2006.01) |
| H01L 27/22 | (2006.01) |
| H01L 43/08 | (2006.01) |
| H01L 43/02 | (2006.01) |

(52) U.S. Cl.
CPC ........... *G01R 33/09* (2013.01); *G01R 33/093* (2013.01); *G01R 33/098* (2013.01); *H01L 27/22* (2013.01); *H01L 43/02* (2013.01); *H01L 43/08* (2013.01)

(56) References Cited

U.S. PATENT DOCUMENTS

| | | | |
|---|---|---|---|
| 5,343,143 A | 8/1994 | Voisine et al. | |
| 5,477,143 A | 12/1995 | Wu | |
| 5,659,499 A | 8/1997 | Chen et al. | |
| 5,739,988 A | 4/1998 | Gill | |
| 5,850,624 A | 12/1998 | Gard et al. | |
| 5,893,981 A | 4/1999 | Dovek et al. | |
| 5,930,087 A | 7/1999 | Brug et al. | |
| 5,940,319 A | 8/1999 | Durlam et al. | |
| 6,023,395 A | 2/2000 | Dill et al. | |
| 6,174,737 B1 | 1/2001 | Durlam et al. | |
| 6,211,090 B1 | 4/2001 | Durlam et al. | |
| 6,501,678 B1 | 12/2002 | Lenssen et al. | |
| 6,545,462 B2 | 4/2003 | Schott et al. | |
| 6,577,124 B2 | 6/2003 | Coehoorn et al. | |
| 6,721,149 B1 | 4/2004 | Shi et al. | |
| 6,724,584 B2 | 4/2004 | Mack et al. | |
| 6,731,108 B2 | 5/2004 | Zalunardo et al. | |
| 6,784,510 B1 | 8/2004 | Grynkewich et al. | |
| 6,875,621 B2 | 4/2005 | Tondra | |
| 7,054,114 B2 | 5/2006 | Jander et al. | |
| 7,116,100 B1 | 10/2006 | Mock et al. | |
| 7,126,330 B2 | 10/2006 | Peczalski et al. | |
| 7,235,968 B2 | 6/2007 | Popovic et al. | |
| 7,259,556 B2 | 8/2007 | Popovic et al. | |
| 7,315,470 B2 | 1/2008 | Parkin | |
| 7,358,722 B2 | 4/2008 | Peczalski et al. | |
| 7,414,396 B2 | 8/2008 | Chung et al. | |
| 7,505,233 B2 | 3/2009 | Grimm et al. | |
| 7,509,748 B2 | 3/2009 | Xue et al. | |
| 7,564,237 B2 | 7/2009 | Rieger et al. | |
| 7,642,773 B2 | 1/2010 | Takahashi et al. | |
| 7,682,840 B2 | 3/2010 | Hiebert et al. | |
| 7,710,113 B2 | 5/2010 | Crolly et al. | |
| 7,833,806 B2 | 11/2010 | Smith et al. | |
| 7,915,886 B2 | 3/2011 | Stolfus et al. | |
| 7,932,571 B2 | 4/2011 | Rizzo et al. | |
| 7,956,604 B2 | 6/2011 | Ausserlechner | |
| 8,044,494 B2 | 10/2011 | Mistry et al. | |
| 8,093,886 B2 | 1/2012 | Okada et al. | |
| 8,193,805 B2 | 6/2012 | Kasajima | |
| 8,257,596 B2 | 9/2012 | Mather et al. | |
| 8,269,491 B2 | 9/2012 | Cummings et al. | |
| 8,278,919 B2 | 10/2012 | Fischer et al. | |
| 8,390,283 B2 | 3/2013 | Mather et al. | |
| 8,476,899 B2 | 7/2013 | Ide et al. | |
| 8,518,734 B2 | 8/2013 | Whig et al. | |
| 9,269,891 B2 | 2/2016 | Whig et al. | |
| 9,362,491 B2 | 6/2016 | Whig et al. | |
| RE46,180 E | 10/2016 | Mather et al. | |
| 9,525,129 B2 | 12/2016 | Whig et al. | |
| 9,530,957 B2 | 12/2016 | Sugihara et al. | |
| 9,553,261 B2 | 1/2017 | Whig et al. | |
| 9,893,274 B2* | 2/2018 | Whig | H01L 43/12 |
| 2002/0131219 A1 | 9/2002 | Mack et al. | |
| 2003/0035249 A1 | 2/2003 | Ho et al. | |
| 2003/0048676 A1 | 3/2003 | Daughton et al. | |
| 2004/0137275 A1 | 7/2004 | Jander et al. | |
| 2004/0137681 A1 | 7/2004 | Motoyoshi | |
| 2004/0164840 A1 | 8/2004 | Xiao et al. | |
| 2004/0207396 A1 | 10/2004 | Xiao | |
| 2005/0013060 A1 | 1/2005 | Grimm | |
| 2005/0036244 A1 | 2/2005 | Carey et al. | |
| 2005/0270020 A1 | 12/2005 | Peczalski et al. | |
| 2005/0275497 A1 | 12/2005 | Ramadan et al. | |
| 2006/0022286 A1 | 2/2006 | Leuschner et al. | |
| 2006/0087318 A1 | 4/2006 | Crolly et al. | |
| 2006/0103381 A1 | 5/2006 | Schmollngruber et al. | |
| 2006/0126229 A1 | 6/2006 | Grimm et al. | |
| 2007/0190669 A1 | 8/2007 | Durlam et al. | |
| 2007/0209437 A1 | 9/2007 | Xue et al. | |
| 2007/0217077 A1 | 9/2007 | Kanaya et al. | |
| 2007/0217080 A1 | 9/2007 | Jayasekara et al. | |
| 2007/0230066 A1 | 10/2007 | Gill | |
| 2009/0052089 A1 | 2/2009 | Antoku et al. | |
| 2009/0115405 A1 | 5/2009 | Guo et al. | |
| 2009/0279212 A1 | 11/2009 | Engel et al. | |
| 2010/0072566 A1 | 3/2010 | Kang et al. | |
| 2010/0148167 A1 | 6/2010 | Whig et al. | |
| 2010/0181999 A1 | 7/2010 | Sudai et al. | |
| 2010/0213933 A1 | 8/2010 | Mather et al. | |
| 2011/0062538 A1 | 3/2011 | Rizzo et al. | |
| 2011/0074406 A1 | 3/2011 | Mather et al. | |
| 2011/0304325 A1 | 12/2011 | Walther et al. | |
| 2012/0200292 A1 | 8/2012 | Sugihara et al. | |
| 2014/0138346 A1 | 5/2014 | Whig et al. | |
| 2015/0177285 A1 | 6/2015 | Higashi et al. | |
| 2016/0104835 A1 | 4/2016 | Whig et al. | |
| 2016/0260894 A1 | 9/2016 | Whig et al. | |
| 2017/0117461 A1 | 4/2017 | Whig et al. | |

FOREIGN PATENT DOCUMENTS

| | | |
|---|---|---|
| CN | 101221849 A | 7/2008 |
| EP | 0427171 A2 | 5/1991 |
| EP | 1054449 A2 | 11/2000 |
| EP | 2006700 A2 | 12/2008 |
| FR | 2717324 A1 | 9/1995 |
| JP | 7-65329 A | 3/1995 |
| JP | 08-75403 A | 3/1996 |
| JP | 2005/502888 A | 1/2005 |
| JP | 2005/197364 | 7/2005 |
| JP | 2005/216390 A | 8/2005 |
| JP | 2006-003116 A | 1/2006 |
| JP | 2006-267120 A | 10/2006 |
| JP | 2008/525789 A | 7/2008 |
| JP | 2009/216390 A | 9/2009 |
| JP | 2009/276159 A | 11/2009 |
| TW | 584735 B | 4/2004 |
| TW | 200604520 | 2/2006 |
| TW | 200849684 A | 12/2008 |
| WO | WO-2008-146809 A1 | 12/2008 |
| WO | WO-2008/148600 A1 | 12/2008 |
| WO | WO-2009/048018 A1 | 4/2009 |
| WO | WO-2009/120894 A2 | 10/2009 |

OTHER PUBLICATIONS

U.S. Appl. No. 12/363,404, filed Jan. 30, 2009.
U.S. Appl. No. 12/567,469, filed Sep. 25, 2009.
PCT Search Report issued in PCT/US2011/030361 dated Jun. 29, 2011.
International Preliminary Report on Patentability and Written Opinion issued in International Application No. PCT/US2011/030361, dated Oct. 2, 2012 (5 pages).
Non-final Office Action issued in U.S. Appl. No. 12/751,927, dated Aug. 31, 2012 (9 pages).

(56) References Cited

OTHER PUBLICATIONS

European Patent Office Search Report issued in corresponding European Application No. 11763327.1, dated Apr. 23, 2015 (4 pages).
International Search Report issued in International Application No. PCT/US2010/050398, dated Nov. 22, 2010 (1 page).
International Preliminary Report on Patentability and Written Opinion issued in International Application No. PCT/US2010/050398, dated Mar. 27, 2012 (7 pages).
Extended European Search Report, dated Oct. 11, 2016, in corresponding European App. No. 16170979.5 (7 pages).
English translation of Notice of Preliminary Rejection issued in corresponding Korean App. No. 10-2011-7014583, dated Feb. 20, 2017 (7 pages).
U.S. Appl. No. 12/567,496, filed Sep. 25, 2009.
International Search Report and Written Opinion issued in International Application No. PCT/US2010/050398, dated Nov. 22, 2010 (8 pages).
International Search Report and Written Opinion issued in International Application No. PCT/US2011/030361, dated Jun. 29, 2011 (7 pages).
Japanese Appeal Decision in Japanese Patent Application No. 2012-531101 dated Jan. 10, 2017 (19 pages).
English translation of Office Action and Search Report in Taiwanese Application No. 104121762 dated Jan. 6, 2017 (3 pages).
Schott et al., CMOS Three Axis Hall Sensor and Joystick Application, IEEE, 2004, pp. 997-980 (4 pages).
Popovic et al., A New CMOS Hall Angular Position Sensor, tm—Technisches Messen, 68, Jun. 1, 2001, pp. 286-291 (6 pages).

\* cited by examiner

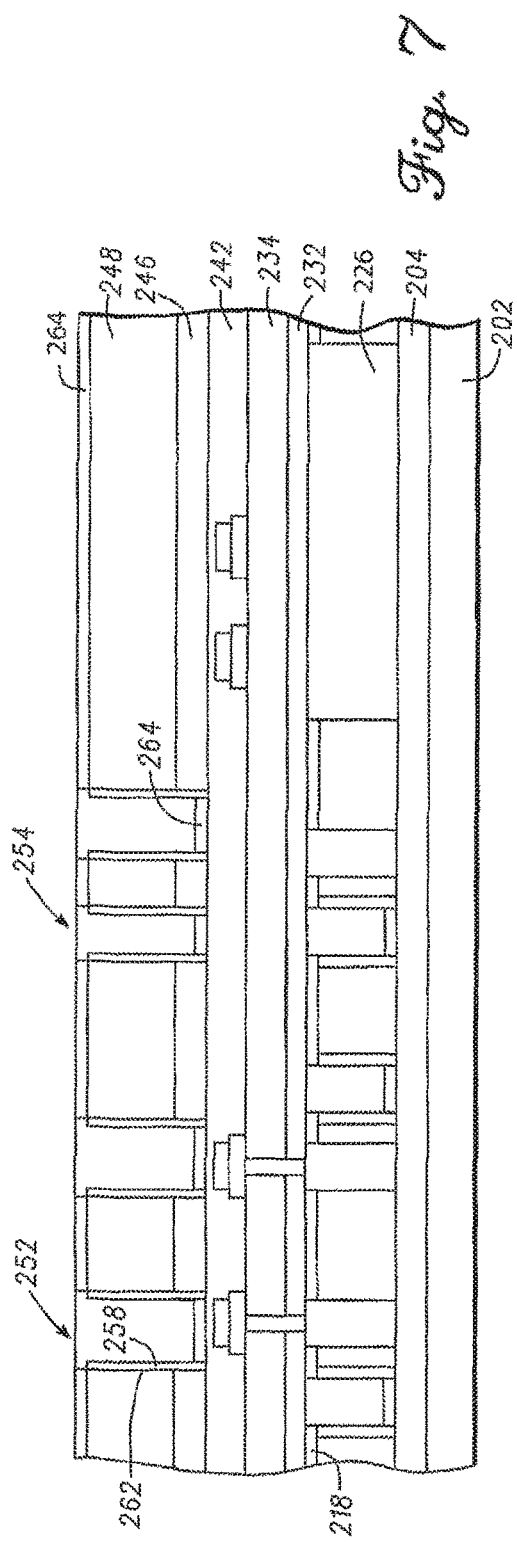
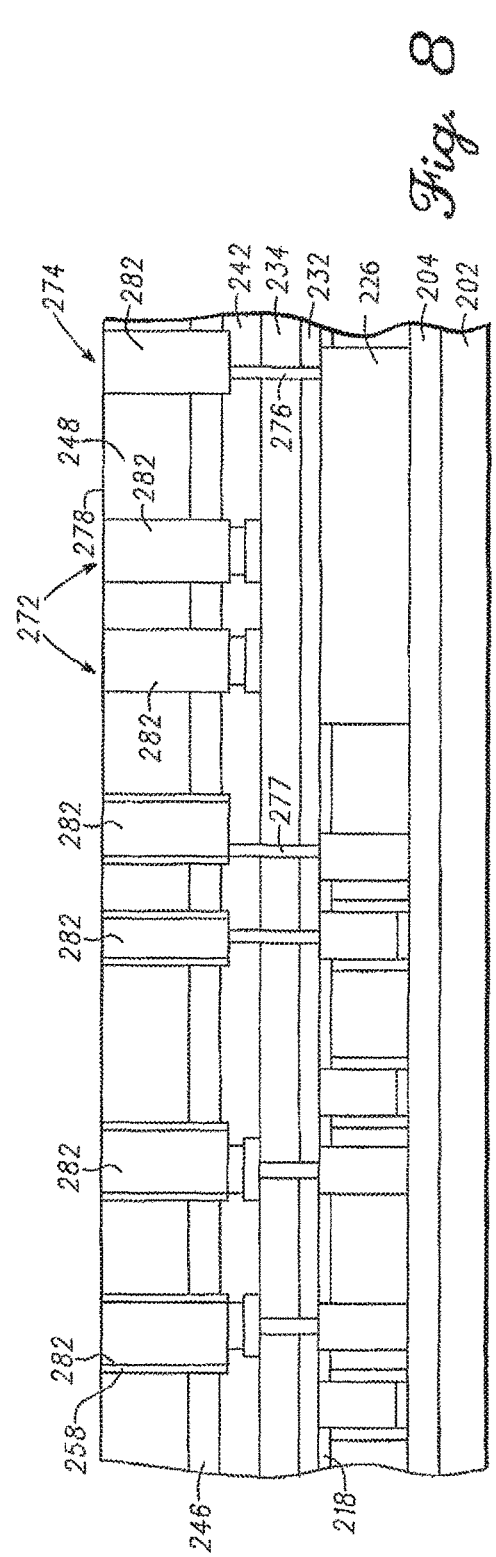

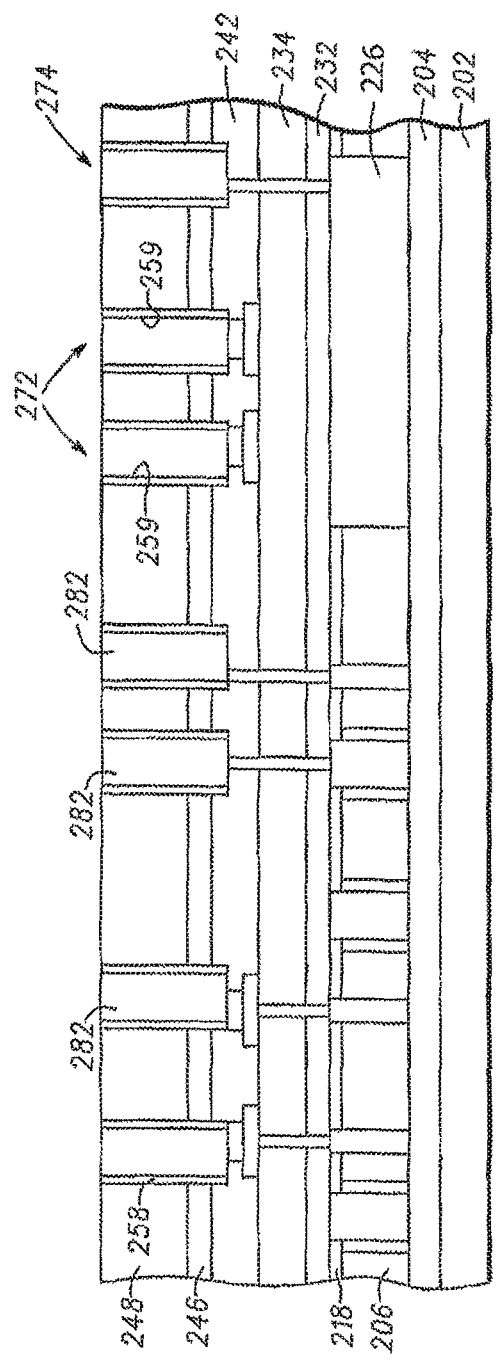

METHODS OF MANUFACTURING A MAGNETIC FIELD SENSOR

CROSS REFERENCE TO RELATED APPLICATIONS

This application is a continuation application of U.S. patent application Ser. No. 15/388,650, filed Dec. 22, 2016, which is a continuation of U.S. patent application Ser. No. 15/145,515, filed May 3, 2016 (now U.S. Pat. No. 9,553, 261, issued on Jan. 24, 2017), which is a continuation application of U.S. patent application Ser. No. 14/954,075, filed Nov. 30, 2015 (now U.S. Pat. No. 9,362,491, issued on Jun. 7, 2016), which is a continuation application of U.S. patent application Ser. No. 13/972,637, filed Aug. 21, 2013 (now U.S. Pat. No. 9,269,891, issued on Feb. 23, 2016), which is a divisional application of U.S. patent application Ser. No. 12/751,927, filed Mar. 31, 2010 (now U.S. Pat. No. 8,518,734, issued on Aug. 27, 2013), each of which is incorporated herein by reference in their entirety. This application also is related to U.S. Pat. No. 9,525,129, issued on Dec. 20, 2016, and also incorporated by reference herein.

FIELD

The present invention generally relates to the field of magnetoelectronic devices and more particularly to a process for integrating on a single chip CMOS-compatible magnetoelectronic field sensors used to sense magnetic fields in three orthogonal directions.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, often comprise anisotropic magneto-resistance (AMR) based devices. In order to arrive at the required sensitivity and reasonable resistances that match well with CMOS, the sensing units of such sensors are generally on the order of square millimeters in size. For mobile applications, such AMR sensor configurations are costly, in terms of expense, circuit area, and power consumption.

Other types of sensors, such as Hall effect sensors, giant magnetoresistance (GMR) sensors, and magnetic tunnel junction (MTJ) sensors, have been used to provide smaller profile sensors, but such sensors have their own concerns, such as inadequate sensitivity and being effected by temperature changes. To address these concerns, MTJ sensors and GMR sensors have been employed in a Wheatstone bridge structure to increase sensitivity and to eliminate temperature dependent resistance changes. Many magnetic sensing technologies are inherently responsive to one orientation of applied field, to the exclusion of orthogonal axes. Indeed, two-axis magnetic field sensors have been developed for electronic compass applications to detect the earth's field direction by using a Wheatstone bridge structure for each sense axis.

For example, Hall sensors are generally responsive to out-of-plane field components normal to the substrate surface, while thin-film magneto-resistive sensors, including most AMR, GMR, and MTJ sensor devices, are responsive to in-plane applied magnetic fields. Utilizing these responsive axes, development of a small footprint three axis sensing solution typically involves a multi chip module with one or more chips positioned at orthogonal angles to one another. For magnetoresistive sensors, the orthogonal in-plane components may be achieved with careful sensor design, but the out-of-plane response is commonly garnered through vertical bonding or solder reflow to contact a secondary chip that has been mounted vertically. As the size of the vertically bonded chip is typically dominated by the pad pitch as determined from the handling constraints, such a technique results in a large vertical extent of the finished package, high die and assembly costs, and makes chip scale packaging difficult and costly, as through-chip vias must be incorporated.

Accordingly, a need exists for an inexpensive fabrication process for packaging a low cost single chip magnetic sensor having a reduced die footprint and that is responsive to an applied magnetic field in three dimensions. There is also a need for a three-axis sensor that can be efficiently and inexpensively constructed as an integrated circuit structure for use in mobile applications. There is also a need for an improved magnetic field sensor and fabrication to overcome the problems in the art, such as outlined above. Furthermore, other desirable features and characteristics of the present invention will become apparent from the subsequent detailed description and the appended claims, taken in conjunction with the accompanying drawings and this background.

BRIEF DESCRIPTION OF THE DRAWINGS

Embodiments of the present invention will hereinafter be described in conjunction with the following drawing figures, wherein like numerals denote like elements.

FIG. 7 is a partial cross section of the Z axis bridge structure of FIG. 1 as it progresses through the process integration in accordance with the first exemplary embodiment;

FIG. 8 is a partial cross section of the Z axis bridge structure of FIG. 1 as it progresses through the process integration in accordance with the first exemplary embodiment;

FIG. 12 is a partial cross section of a modification of FIG. 8 in accordance with a second exemplary embodiment;

Figure 1:
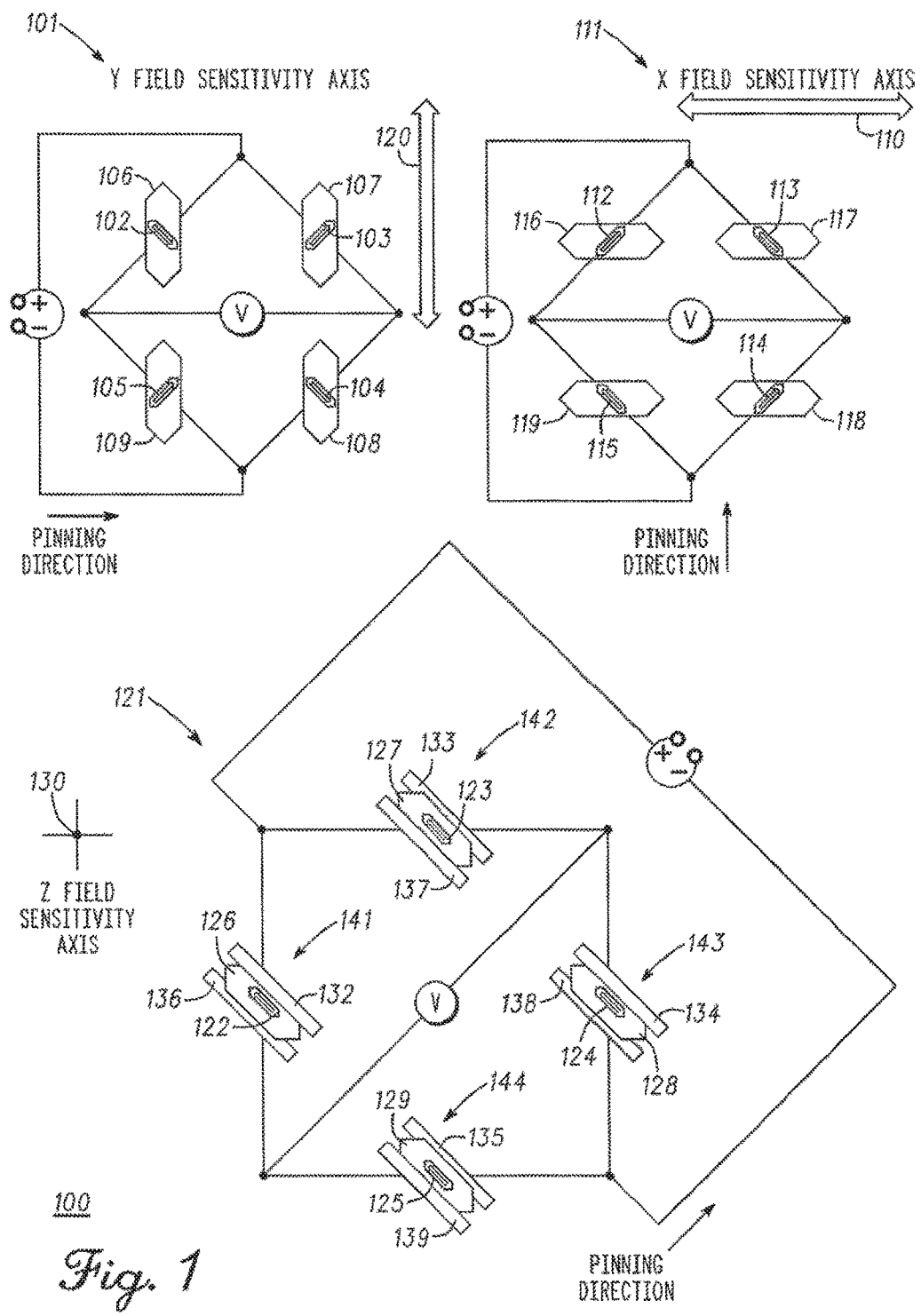
FIG. 1 illustrates a three-axis magnetic field sensor structure which uses differential sensors formed from three bridge structures with MTJ sensors that may be integrated in accordance with exemplary embodiments.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

SUMMARY

A method of integrating a single chip three-axis magnetic field element having a film plane with an in-plane field sensitivity and out-of-plane thin-film flux guides configured to respond to magnetic field components perpendicular to the film plane includes etching a first and a second plurality of trenches within a first dielectric layer, each trench of the first and second plurality of trenches having a bottom and a side; depositing a first material on the sides of each of at least the first plurality of trenches, the first material having a high magnetic permeability; depositing a second material in the first plurality of trenches and a third material within the second plurality of trenches, the third material being electrically conductive; depositing a second dielectric layer over the first dielectric layer and the first and second plurality of trenches; forming a first plurality of conductive vias through the second dielectric layer to the third material in a first portion of the second trenches; forming a first plurality of thin-film magneto-resistive field sensor elements upon the second dielectric layer positioned adjacent to the sides of the first plurality of trenches, one each of the first plurality of thin-film magneto-resistive field sensor elements electrically coupled to one of the first plurality of vias; and depositing a third dielectric layer over the second dielectric layer and the first plurality of thin-film magneto-resistive field sensor elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Through the integration of high aspect ratio vertical bars (flux guides) of a magnetically permeable material, typically having a permeability of greater than 100 and more preferably having a permeability of greater than 1000 such as nickel iron alloys (NiFe), whose edges terminate in close proximity to opposed edges and opposite sides of a magnetic sense element, a portion of the vertical (Z-axis) field can be brought into the plane of the sense element (the X-Y plane). Permeability is the degree of magnetization that a material obtains in response to an applied magnetic field. These flux guides serve to capture magnetic flux from the Z component of an applied magnetic field, and in so doing, bend the field lines in a substantially horizontal manner near the ends of the flux guides. Through asymmetric positioning of the flux guides, e.g., the flux guide segment above the left edge of sense elements in two legs of the four legs of a Wheatstone bridge, and the flux guide above the right edge of sense elements in the other two legs, the horizontal components may act in opposite directions for the two pairs of legs resulting in a strong differential signal. A field applied in the X or Y direction will project equally on all four legs of the bridge and, with the proper sense element design, can be subtracted out from and not contribute to the final sensor signal. Separate bridges are included elsewhere on the magnetic sensor chip for determining the X and Y components of the magnetic signal, and in this manner, a field with components in all three spatial orientations can be accurately determined by a single chip magnetoresistive sensing module, for example, based on magnetic tunnel junction (MTJ) sense elements. Finite Element Method (FEM) simulations have shown that a pair of high aspect ratio flux guides, e.g., 25 nm wide by 500 nm high and extending several microns in the third direction, when optimally positioned will provide a signal on an individual element that is about 80% of the signal measured from an in plane (x axis) field of the same strength. Additional signal may be obtained through closer proximity of the flux guide to the sensor, increases in the flux guide height, and additional shaping of the guide geometry. One example is to add horizontal segments parallel to the sense element which extend over the edges of the sense element. Other examples are to form a U which is placed with the interior horizontal segment aligned with the outer edge of the sense element, angled termination of the vertical segments to extend the flux guide partially in the plane of the sense element, and a similarly placed box structure. These geometries serve to further enhance the horizontal component of the guided flux and move it to a more central region of the sensor. A structure with individual 25 nm wide vertical bars utilized as flux guides is tolerant to overlay errors and produces an apparent x to z field conversion (for a differentially wired Wheatstone bridge) at the rate of 2.5% for a misalignment of 85 nm between a single flux guiding layer and the sense layer.

The flux guiding layer may be formed from layers typically used in the magnetic random access memory (MRAM) process flow, during which bit and digit lines cladded with a high permeability magnetic material (such as NiFe-based or CoFe-based alloys) on three sides, referred to herein as a flux guide, are used to increase the field factors present to reduce the current needed to switch the memory storage element. In the sensor application, similar processes may be used with the optional additional step of sputtering out the bottom of the digit line in order to remove any cladding present on the trench's bottom. Modifications may be made to the process flow so that the height and width of the cladding used for flux guiding are at optimum values instead of the 500 nm and 25 nm, respectively, that are used in the exemplary process described above.

A method and apparatus are subsequently described in more detail for providing multi-axis pinning on a bulk wafer which may be used to form an integrated circuit sensor with different reference layers having three different pinning directions, two of which are substantially orthogonal, that are set with a single pinning material deposition and bulk wafer setting procedure. As a preliminary step, a stack of one or more layers of ferromagnetic and antiferromagnetic materials are etched into shaped reference layers having a two-dimensional shape with a high aspect ratio, where the shape provides a distinction for the desired magnetization direction for each reference layer. Depending on the materials and techniques used, the final magnetization direction may be oriented along the short axis or the long axis of the shaped layer. For example, if the reference layer is formed with a slightly imbalanced synthetic anti-ferromagnet (SAF) patterned into micron-scale dimensions, the magnetization will direct along the short axis. As will be appreciated by those skilled in the art, the SAF embodiment provides a number of benefits related to the use of pinned-SAF reference layers in magnetoelectronic devices. In other embodiments, by controlling the thicknesses of the pinned and fixed layers and the in-plane spatial extent of the patterned structure, the final magnetization may be directed along the long axis. Using shape anisotropy, different magnetization directions are induced in the reference layers by heating in the presence of an orienting field that is aligned between the desired magnetization directions for the reference layers. In selected embodiments, the reference layers are heated sufficiently to reduce the material component of the anisotropy and allow the shape and external field to dominate the magnetization direction. In this manner, once the orienting field is removed, the shape anisotropy directs the magnetization in the desired direction. Upon removing the orienting field, the magnetizations of the reference layers relax to follow the shape of the reference layers so as to induce a magnetization that is aligned along the desired axis of the shaped reference layer. An optional compensating field may be applied to help induce orthogonality, and the reference layers are then heated to above the phase transition temperature of the antiferromagnetic pinning layers. For example, if two reference layers are shaped to have longer dimensions which are perpendicular to one another, then the induced magnetizations for the two reference layers will be approximately perpendicular to one another. A small compensation angle may be introduced so that while the long axis of the two reference layers are not perpendicular, the resultant induced magnetizations are substantially perpendicular to one another.

Figure 2:
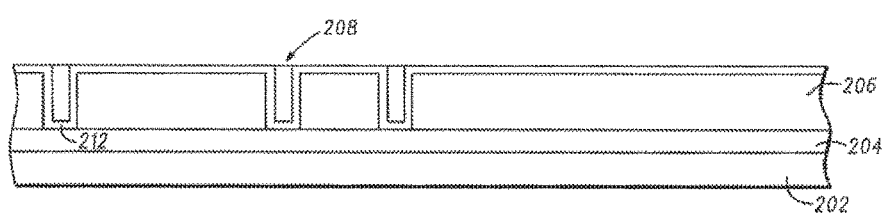
FIG. 2 is a partial cross section of the Z axis bridge structure of FIG. 1 as it progresses through the process integration in accordance with a first exemplary embodiment.
Figure 3:
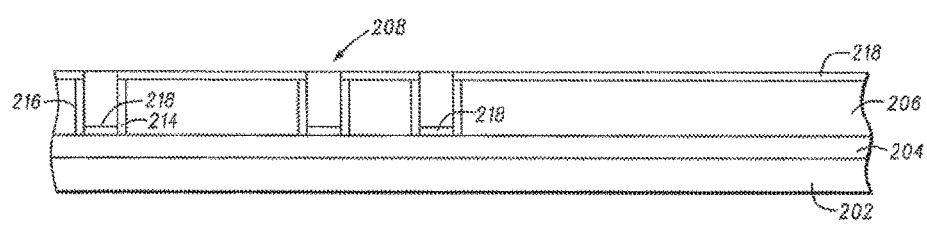
FIG. 3 is a partial cross section of the Z axis bridge structure of FIG. 1 as it progresses through the process integration in accordance with the first exemplary embodiment.
Figure 4:
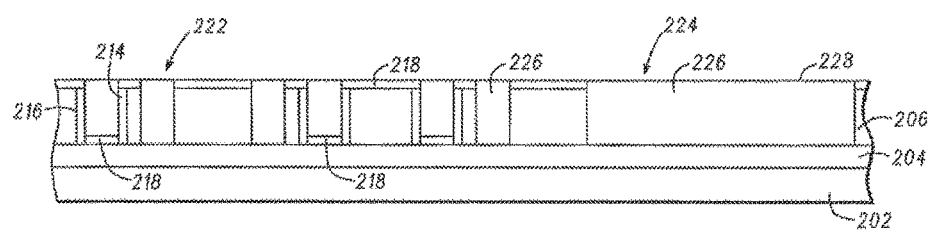
FIG. 4 is a partial cross section of the Z axis bridge structure of FIG. 1 as it progresses through the process integration in accordance with the first exemplary embodiment.

FIG. 1 is a magnetic field sensor 100 formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 1 is situated. Exemplary embodiments of the first and second sensors 101, 111 are described in detail in U.S. patent application Ser. No. 12/433,679, now U.S. Pat. No. 8,257,596. As depicted herein, each sensor 101, 111, 121 is formed with unshielded sense elements that are connected in a bridge configuration. Thus, the first sensor 101 is formed from the connection of a plurality of sense elements 102-105 in a bridge configuration over a corresponding plurality of reference layers 106-109, where each of the reference layers 106-109 is magnetized in the x-axis direction. In similar fashion, the second sensor 111 is formed from the connection of a plurality of sense elements 112-115 in a bridge configuration over a corresponding plurality of reference layers 116-119 that are each magnetized in the y-axis direction that is perpendicular to the magnetization direction of the reference layers 106-109. Furthermore, the third sensor 121 in the same plane as the first and second sensors 101, 111 is formed from the connection of a plurality of sense elements 122-125 in a bridge configuration over a corresponding plurality of reference layers 126-129 that are each magnetized in the xy-axis direction that is at about 45 degrees to the magnetization direction of the reference layers 106-109 and 116-119. In certain embodiments, reference direction of the third sensor 121 may lie along another axis. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the reference layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the reference layers 116-119. In the third bridge configuration 121, the sense elements 122, 123, 124, and 125 all have an easy axis magnetization direction that is orthogonal to the reference magnetization direction of the reference layers 126, 127, 128, and 129. The third bridge configuration 121 further includes flux guides 132-135 positioned adjacent to the right edge of sense elements 122-125, and flux guides 136-139 positioned adjacent to the left edge of sense elements 122-125, respectively. Flux guides 132, 137, 134, and 139 are positioned above sense elements 122-125, and flux guides 136, 133, 138, and 135 are positioned below sense elements 122-125. The positioning of these flux guides 132-139 is subsequently described in more detail in FIG. 2. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by approximately 90 degrees for the X and Y sensors, and referencing a sense element that responds in an opposite manner to an applied field in the Z direction for the Z sensor. The Z sensor referencing will be described in more detail below. The configuration shown in FIG. 1 is not required to harvest the benefits of the third sensor 121 structure described in more detail in FIGS. 2-9, and is only given as an example.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 132-139 are positioned in sensor 121 above and below the opposite edges of the elements 122-125, in an asymmetrical manner between legs 141, 143 and legs 142, 144. As flux guides 132, 134 are placed above the sense elements 122, 124, the magnetic flux from the Z-component of an external magnetic field may be guided by the flux guides 132 and 134 into the xy plane along the right side and cause the magnetization of sense elements 122 and 124 to rotate in a first direction towards a higher resistance. Similarly, the magnetic flux from the Z field may be guided by the flux guides 133 and 135 into the xy plane along the right side of the sense element and cause the magnetization of sense elements 123 and 125 to rotate in a second direction, opposite from the first direction towards a lower resistance, as these flux guides are located below the sense elements 123, 125. Thus, the sensor 121 can detect the component directions of an applied field along the orthogonal (Z) axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. See for example, U.S. Pat. No. 6,174,737. Each of the reference layers 106-109, 116-119, and 126-129 may be formed with one or more lower ferromagnetic layers, and each of the sense elements 102-105, 112-115, 122-125 may be formed with one or more upper ferromagnetic layers. An insulating tunneling dielectric layer (not shown) may be disposed between the sense elements 102-105, 112-115, 122-125 and the reference layers 106-109, 116-119, and 126-129. The reference and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, reference layers 106-109, 116-119, and 126-129 may be formed with one or more layers of ferromagnetic and antiferromagnetic materials to a combined thickness in the range 10 to 1000 Å, and in selected embodiments in the range 250 to 350 Å. In an exemplary implementation, each of the reference layers 106-109, 116-119, and 126-129 is formed with a single ferromagnetic layer and an underlying anti-ferromagnetic pinning layer. In another exemplary implementation, each reference layer 106-109, 116-119, and 126-129 includes a synthetic anti-ferromagnetic stack component (e.g., a stack of Cobalt Iron (CoF), Ruthenium (Ru) and Cobalt Free Boron (CoFeB) which is 20 to 80 Å thick, and an underlying pinning layer that is approximately 200 Å thick. The lower anti-ferromagnetic pinning materials may be re-settable materials, such as IrMn and FeMn, though other materials, such as PtMn can be used which are not readily re-set at reasonable temperatures. As formed, the reference layers 106-109, 116-119, and 126-129 function as a fixed or pinned magnetic layer when the direction of its magnetization is pinned in one direction that does not change during normal operating conditions. As disclosed herein, the heating qualities of the materials used to pin the reference layers 106-109, 116-119, and 126-129 can change the fabrication sequence used to form these layers.

One of each of the sense elements 102-105, 112-115, 122-125 and one of each of the reference layers 106-109, 116-119, 126-129 form a magnetic tunnel junction (MTJ) sensor. For example, for bridge circuit 121, sense element 122 and reference layer 126 form an MTJ sensor 141. Likewise, sense element 123 and reference layer 127 form an MTJ sensor 142, sense element 124 and reference layer 128 form an MTJ sensor 143, and sense element 125 and reference layer 129 form an MTJ sensor 144.

The reference layers 106-109, 116-119, and 126-129 may be formed with a single patterned ferromagnetic layer having a magnetization direction (indicated by the arrow) that aligns along the long-axis of the patterned reference layer(s). However, in other embodiments, the reference layer may be implemented with a synthetic anti-ferromagnetic (SAF) layer which is used to align the magnetization of the reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-115, 122-125 may be formed with one or more layers of ferromagnetic materials to a thickness in the range 10 to 5000 Å, and in selected embodiments in the range 10 to 100 Å. The upper ferromagnetic materials may be magnetically soft materials, such as NiFe, CoFe, Fe, CoFeB and the like. In each MTJ sensor, the sense elements 102-105, 112-115, 122-125 function as a sense layer or free magnetic layer because the direction of their magnetization can be deflected by the presence of an external applied field, such as the Earth's magnetic field. As finally formed, sense elements 102-105, 112-115, 122-125 may be formed with a single ferromagnetic layer having a magnetization direction (indicated with the arrows) that aligns along the long-axis of the patterned shapes.

The reference layers 106-109, 116-119, 126-129 and sense elements 102-105, 112-115, 122-125 may be formed to have different magnetic properties. For example, the reference layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-115, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

The reference layers 106-109, 116-119, 126-129 in the MTJ sensors are formed to have a shape determined magnetization direction in the plane of the reference layers 106-109, 116-119, 126-129 (identified by the vector arrows for each sensor bridge labeled "Pinning direction" in FIG. 1). As described herein, the magnetization direction for the reference layers 106-109, 116-119, 126-129 may be obtained using shape anisotropy of the pinned electrodes, in which case the shapes of the reference layers 106-109, 116-119, 126-129 may each be longer in the pinning direction for a single reference layer. Alternatively, for a pinned SAF structure, composed of two or more ferromagnetic layers separated by coupling spacer layers, the ferromagnetic layers may be shorter along the pinning direction. In particular, the magnetization direction for the pinned layers 106-109, 116-119, 126-129 may be obtained by first heating the shaped reference layers 106-109, 116-119, 126-129 in the presence of an orienting magnetic field which is oriented non-orthogonally to the axis of longest orientation for the shaped reference layers 106-109, 116-119, 126-129 such that the applied orienting field includes a field component in the direction of the desired pinning direction for the reference layers 106-109, 116-119, 126-129. The magnetization directions of the reference layers are aligned, at least temporarily, in a predetermined direction. However, by appropriately heating the reference layers during this treatment and removing the orienting field without reducing the heat, the magnetization of the reference layers relaxes along the desired axis of orientation for the shaped reference layers 106-109, 116-119, 126-129. Once the magnetization relaxes, the reference layers can be annealed and/or cooled so that the magnetic field direction of the reference electrode layers is set in the desired direction for the shaped reference layers 106-109, 116-119, 126-129.

The structure of the sensor devices 141-144 of the third bridge circuit 121 include the reference layers 126-129, the sense elements 122-125, and the flux guides 132-139, all formed within the dielectric material 140 and integrated with the process disclosed herein. The flux guide 136 has an end positioned below an edge of the sensor element 122. The flux guides 133 and 138 have ends positioned below edges of the sensor elements 123 and 124, respectively. The flux guide 135 has an end positioned below an edge of the sensor element 125. The flux guides 132 and 137 have ends positioned above edges of the sensor elements 122 and 123, respectively, and the flux guides 134 and 139 have ends positioned above edges of the sensor elements 124 and 125, respectively. The ends of the flux guides may be brought as close as possible to the sensor elements, with a preferable spacing of less than or equal to 250 nm between the two. The sense elements are brought as close as possible for the tightest density array, preferably less than 2.5 um apart.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

Various illustrative embodiments of the process integration will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

Referring to FIGS. 2 and 10A, 10B, and 10C, and in accordance with an exemplary embodiment of the integration process, a first etch stop layer 204 is deposited 1002 (FIG. 10A) over a substrate 202. A first dielectric layer 206 is deposited 1004 over the first etch stop layer 204 and a plurality of first trenches 208 are etched 1006 through the first dielectric layer 206 to the first etch stop layer 204. A magnetically permeable material 212, having a permeability greater than 100 and preferably greater than 1000, such as a NiFe or CoFeB, is deposited 1008 within the first plurality of trenches 208 and on the first dielectric layer 206. The magnetically permeable material 212 is back sputtered away 1010 (FIG. 3) from the bottom of the first plurality of trenches 208 and from the top of the first dielectric layer 206, resulting in a magnetically permeable layer 214 (also referred to as cladding, or flux guide, or flux concentrators) on the sides 216 of the first plurality of trenches 208. Furthermore, the step of forming the magnetically permeable material on the sides 216 of the first plurality of trenches 208 may be shortened in time or eliminated to allow some of the magnetically permeable material to remain on the bottom of the first and second plurality of trenches 208, 222 and the first region 224, thereby providing a "U" shaped flux guide upon removal of magnetically permeable material from the top surface of the first dielectric layer 206 in a subsequent step, for example by polishing.

A second dielectric layer 218 is then deposited 1012 on the etch stop layer 204 in the trenches 208 and on the dielectric layer 206. If the deposition process is conformal, the second dielectric layer 218 will also cover the flux guides 216.

A second plurality of trenches 222 (FIG. 4) and a first region 224 are etched 1014 through the first dielectric layer 206 to the first etch stop layer 204 and, preferably, a conductive material 226, e.g., copper, is deposited 1016 in the first and second plurality of trenches 208, 222 and the first region 224 and polished 1018 to provide a smooth surface 228. Alternatively, a metal such as aluminum could be deposited and then subtractively patterned to form conductive lines separated by the first and second plurality of trenches 208, 222 after which the magnetically permeable cladding might be applied to the sides of the trench on the remaining aluminum, for example by sputter deposition. The first region 224 may be a trench formed orthogonal to the second plurality of trenches 222. In this case, the filled trenches 208 are subtractively patterned metal. Alternatively, the first plurality of trenches 208 may be filled with a dielectric material. Furthermore, the conductive material 226 may be deposited as two separate layers, a first layer within the first plurality of trenches 208 and a second layer within the first region 224 and second plurality of trenches 222.

Figure 11:
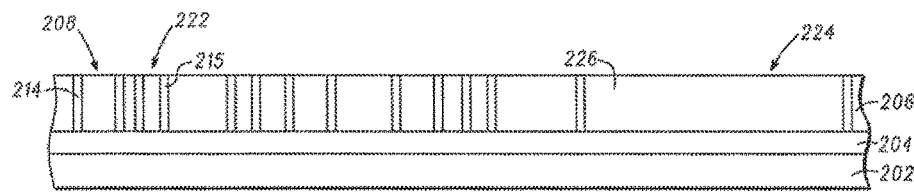
FIG. 11 is a partial cross section of a modification of FIG. 4 in accordance with a second exemplary embodiment.
Figure 10A:
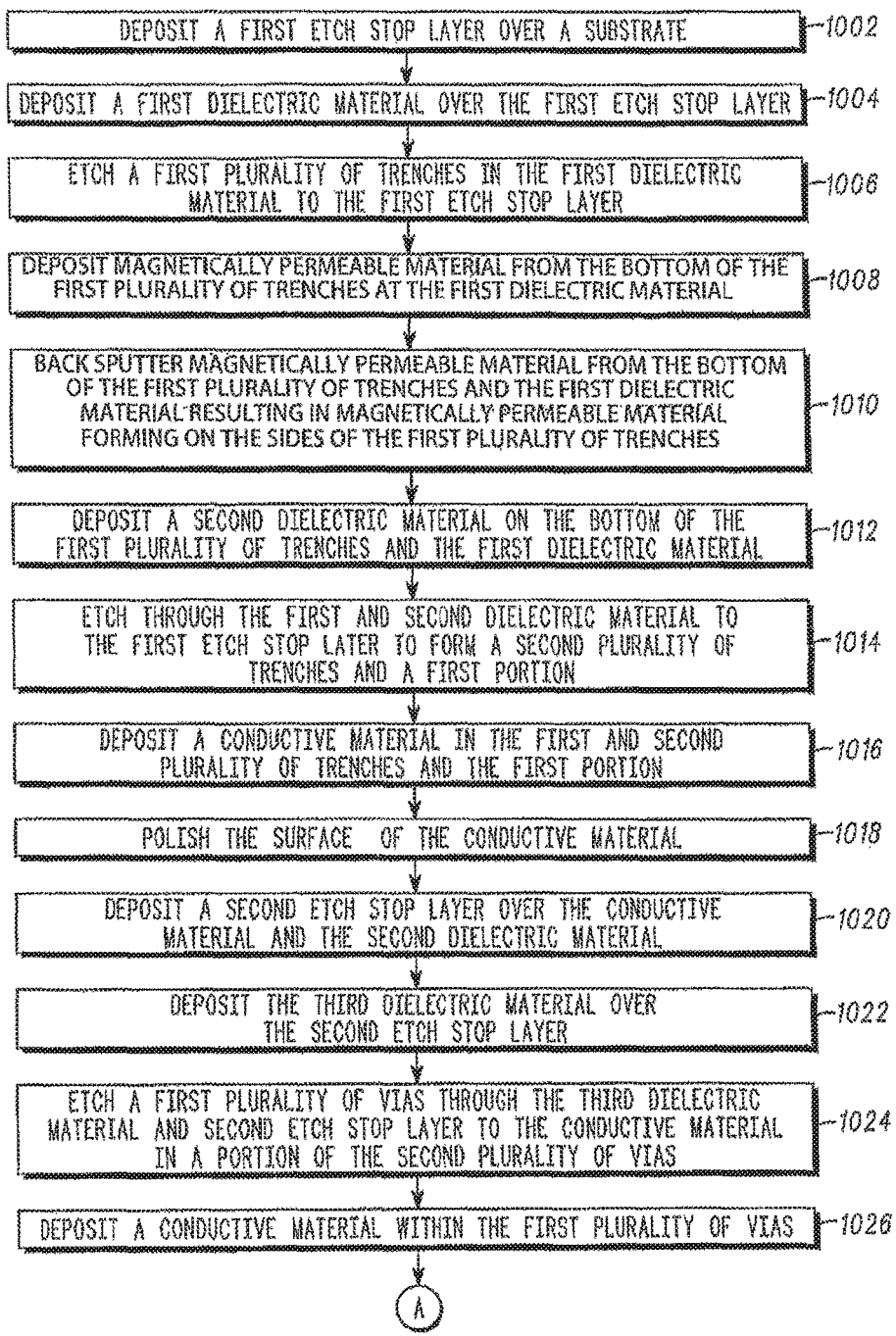
FIGS. 10A, 10B, and 10C are flow charts of the steps of the process integration in accordance with the first exemplary embodiment of FIGS. 2-9.
Figure 10B:
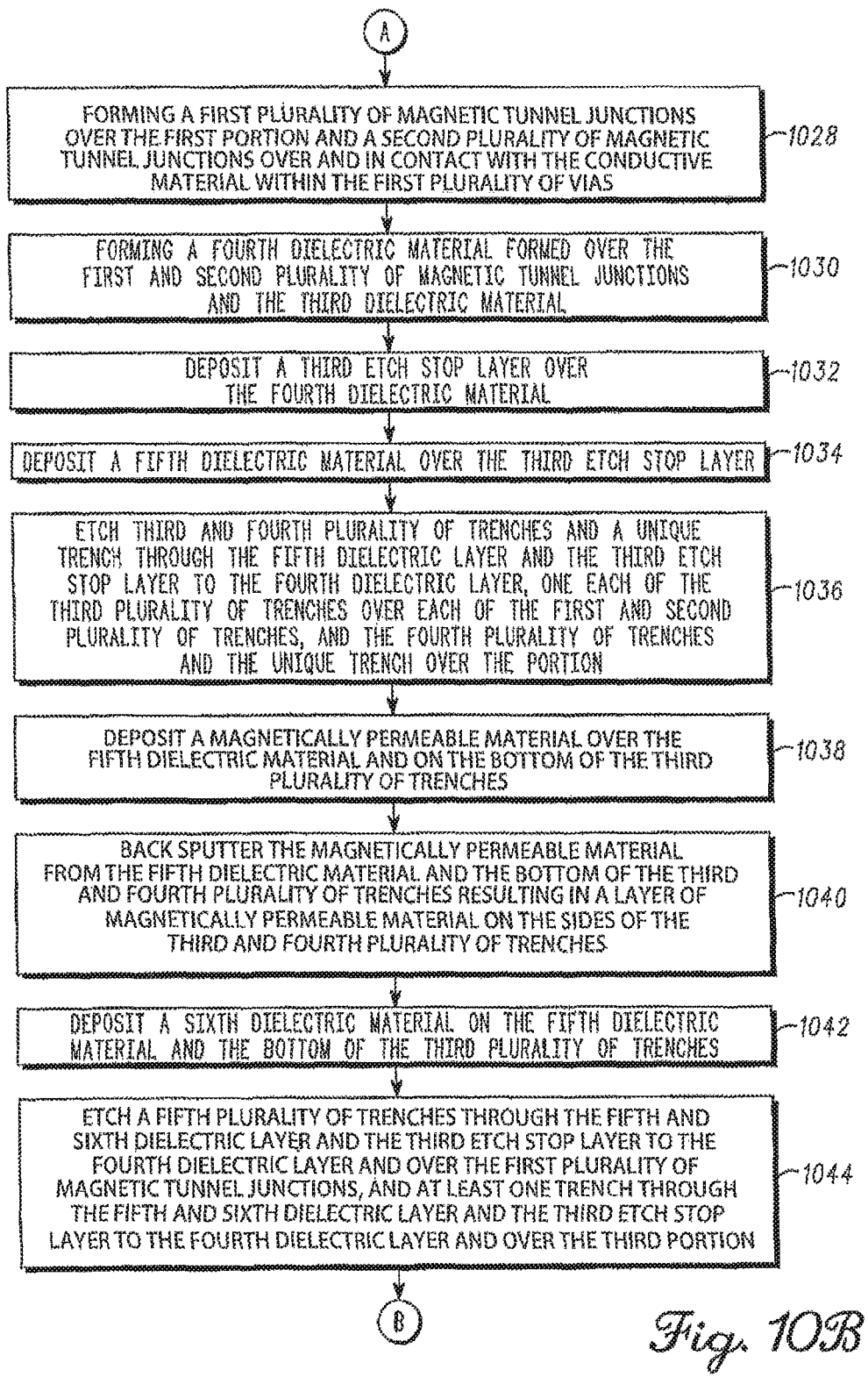
Figure 10C:
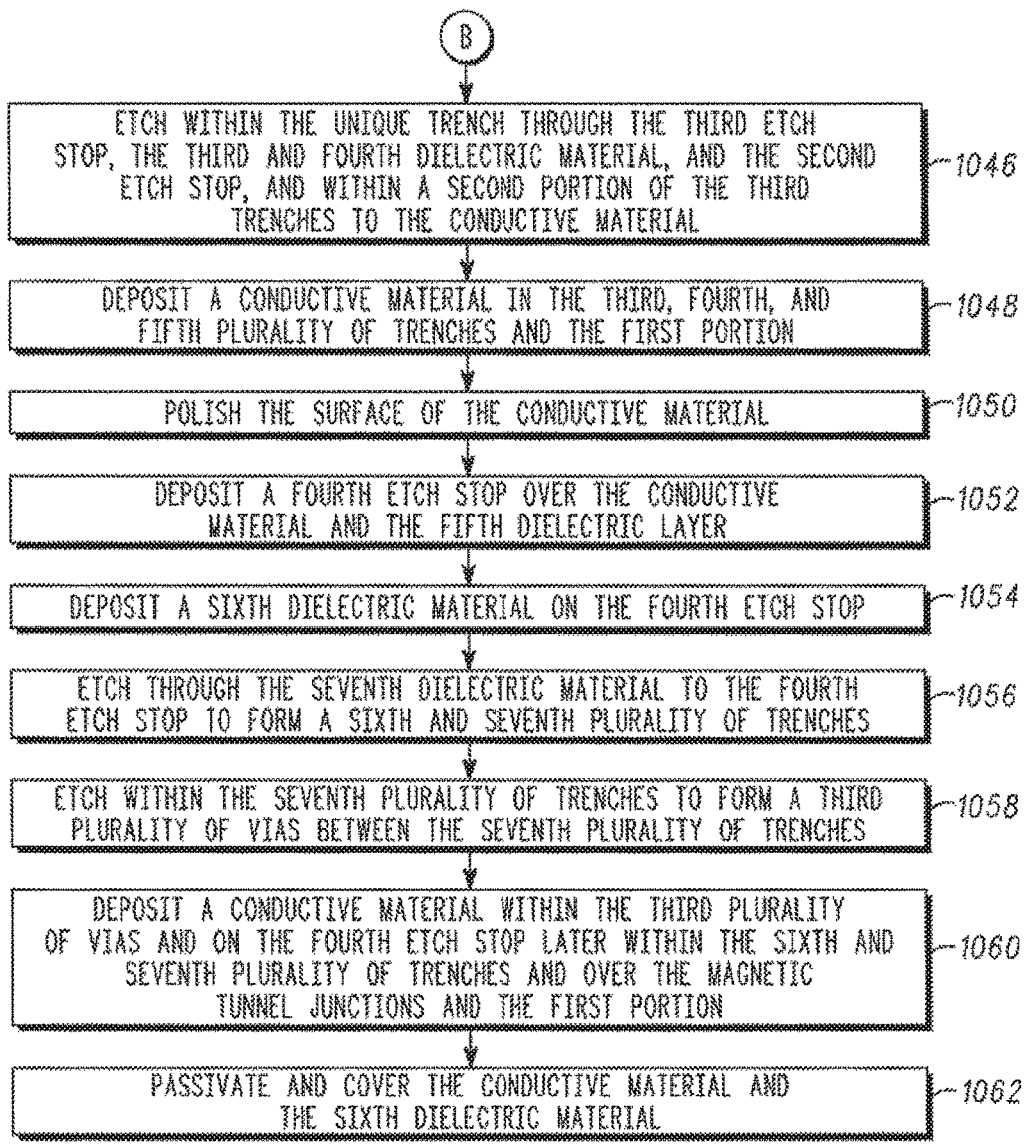

Magnetically permeable material 215 (see FIG. 11) may also be formed in the second plurality of trenches 222 and the region 224 at the same time as the flux guides 214 are formed.

Figure 5:
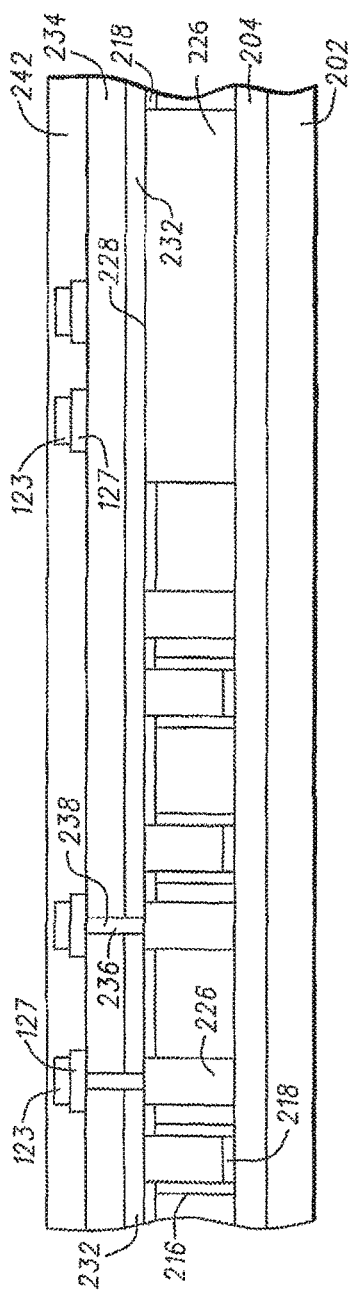
FIG. 5 is a partial cross section of the Z axis bridge structure of FIG. 1 as it progresses through the process integration in accordance with the first exemplary embodiment.

Referring to FIG. 5, a second etch stop layer 232 is deposited 1020 on the surface 228 and a third dielectric layer 234 is deposited over the second etch stop layer 232. A first plurality of vias 236 are etched 1024 through the third dielectric 234 and the second etch stop layer 232 to the conductive material 226 in a portion of the second plurality of trenches 222, and a conductive material 238 is placed 1026 within the first plurality of vias 236. A first plurality of tunnel junction sensors, each including the sense element 123 and the reference layer 127 (FIG. 1), are formed 1028 (FIG. 10B) on the third dielectric layer 234, with each of the reference layers 127 making contact with one of the first plurality of the conductive material 238 within the first plurality of vias 236. A second plurality of tunnel junction sensors, each including the sense element 123 and the reference layer 127 are formed 1028 on the third dielectric layer 234 and over the region 206. Dielectric layer 242 is then deposited 1030 over the first plurality of tunnel junction sensors and third dielectric layer 234.

Figure 6:
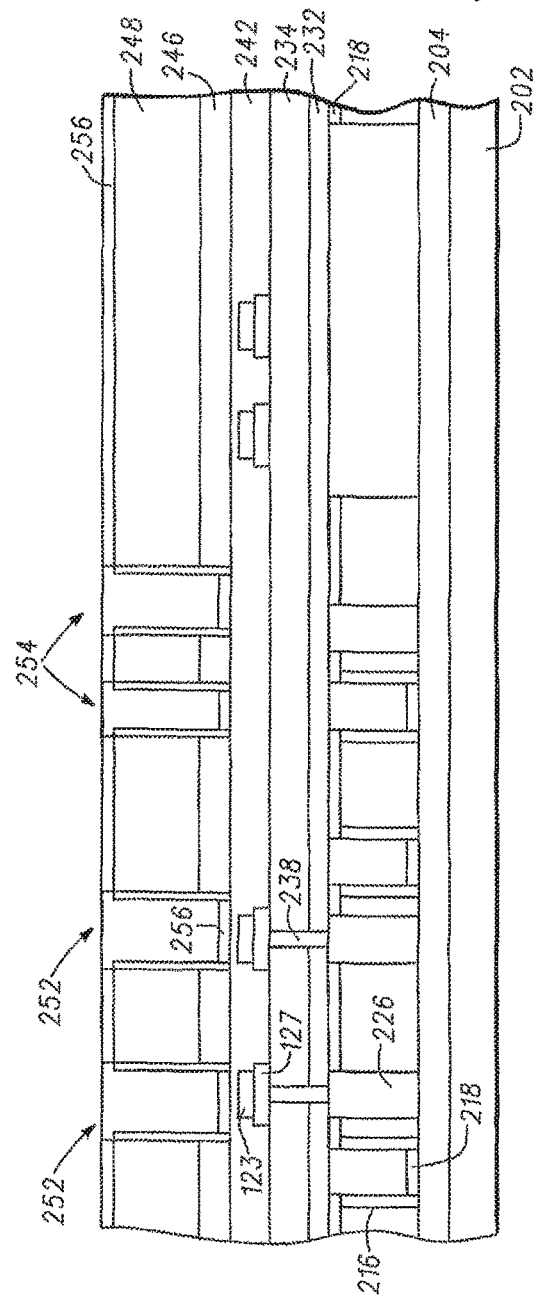
FIG. 6 is a partial cross section of the Z axis bridge structure of FIG. 1 as it progresses through the process integration in accordance with the first exemplary embodiment.
Figure 9:
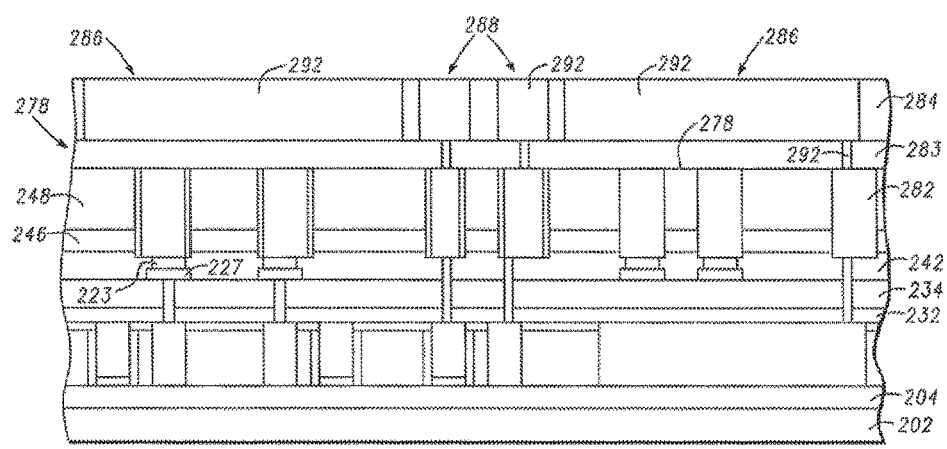
FIG. 9 is a partial cross section of the Z axis bridge structure of FIG. 1 as it progresses through the process integration in accordance with the first exemplary embodiment.

Referring to FIG. 6, a third etch stop layer 246 is deposited 1032 over the fourth dielectric layer 242 and a fifth dielectric layer 248 is deposited 1034 over the third etch stop layer 246. Third and fourth plurality of trenches 252, 254 are etched 1036 through the fifth dielectric layer 248 and the third etch stop layer 246, with one each of the third plurality of trenches 252 formed over one each of the sense elements 123, while the fourth plurality of trenches 254 are formed over the first and second trenches 208, 222 not having a sense element 123 therebetween. A magnetically permeable material 256 is deposited 1038 within the third and fourth plurality of trenches 252, 254 and on the fifth dielectric layer 248.

Referring to FIG. 7, the magnetically permeable material 256 is backsputtered away 1040 (FIG. 10B) from the bottom of the third and fourth plurality of trenches 252, 254, resulting in a magnetically permeable layer 258 on the sides 262 (also referred to as cladding, flux guide, or flux concentrators) of the third and fourth plurality of trenches 252, 254. A sixth dielectric layer 264 is deposited 1042 on the fourth dielectric 242 in the trenches 252, 254 and on the fifth dielectric layer 248.

Referring to FIG. 8, a fifth plurality of trenches 272 are etched 1044 through the sixth and fifth dielectric layers 264, 248, the third etch stop layer 246, and a portion of the fourth dielectric layer 242 to the sense elements 123, while a trench 274 is etched through the sixth and fifth dielectric layers 264, 248, the third etch stop layer 246, and a portion of the fourth dielectric layer 242, all over the first region 224. The fifth plurality of trenches 272 and the trench 274 may also contain flux concentrators 259 as shown in FIG. 12. These flux concentrators 259 would preferably be formed in the same manner and with the same process as the flux concentrators 258. A further etch is performed 1046 (FIG. 10C) within the trench 274 to form a second via 276 through the fourth and third dielectric layers 242, 234 and the etch stop layer 232 to the conductive material 226, and within the trenches 254 to form third vias 277. At the same time vias 277 are etched as well. A conductive material 282, e.g., copper, is then filled 1048 within the third, fourth, and fifth trenches and the unique trench 274 and polished 1050 to form the smooth surface 278. This conductive material also fills vias 276 and 277.

A fourth etch stop layer 283 is deposited 1052 on the surface 278 (FIG. 9), and a seventh dielectric layer 284 is deposited 1054 on the fourth etch stop layer 283. A sixth and seventh plurality of trenches 286, 288 are etched 1056 in the seventh dielectric layer 284 to the fourth etch stop layer 283. Another etch is performed 1058 in the sixth and one of the seventh plurality of trenches 286, 288 to form a third plurality of vias 292 between the sixth and the one of the seventh plurality of trenches 286, 288 to the fourth plurality of trenches 254 and the trench 274, respectively. A conductive material 292 such as copper is filled 1060 within the sixth and seventh trenches 286, 288 and the third plurality of vias 292. The filled sixth plurality of trenches is a conductor to provide a stabilization field. The structure 200 is then passivated 1062 in a well known manner. Alternatively, Al metal may be deposited before the dielectric 284 is deposited and then etched to form the patterned top metal, and then a dielectric 284 may be deposited over top.

Figure 13:
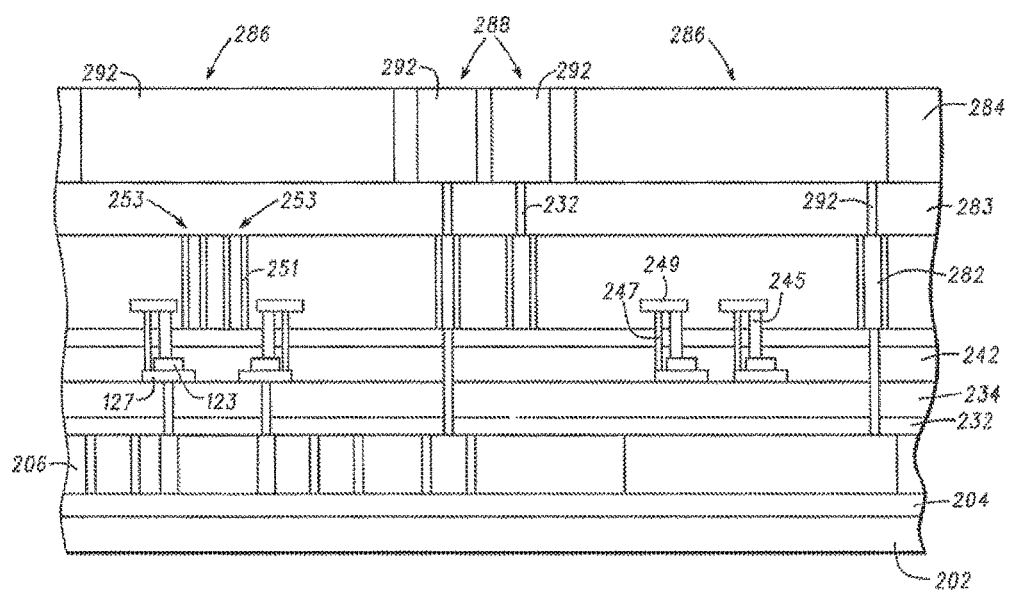
FIG. 13 is a partial cross section of a modification of FIG. 6 in accordance with a third exemplary embodiment.

In another exemplary embodiment (FIG. 13), the trenches 253 (FIG. 12) are formed at the same time as third and fifth trenches 252, 272 (see FIG. 8), and all regions have magnetically permeable flux guides deposited and sputtered. This simplifies the process by removing the separate dielectric deposition and photo step.

In another exemplary embodiment (FIG. 11), the trenches 224, 222 (FIG. 12) are formed at the same time as trenches 208 (see FIG. 8), and all regions have magnetically permeable flux guides deposited and sputtered. This further simplifies the process by removing the separate dielectric deposition and photo step.

In another exemplary embodiment (FIG. 13), after deposition of the third etch stop layer 246, contact to the sensor is made through deposition of a thin dielectric layer (not shown) formed on the third etch stop layer 246, and subsequent etching of a via that stops on the upper electrode of the sense layer 123. At the same time this via 245 is etched, a slightly deeper via 247 is etched that stops on the lower electrode 127 beside the patterned sense layer 123 creating a contact path to the reference layer 127. Both vias are filled as a Ta, TaN, Ti or other metal local interconnect layer 249 is deposited. This local interconnect 249 is then patterned, and dielectric 248 is deposited over top. The upper flux guides trenches (253) may be fabricated as described above, but are physically offset from the sense layer 123 and do not make electrical contact to it. This allows for more freedom in sensor layout and design.

In yet another embodiment, after deposition of the local interconnect layer 249 mentioned in the preceding paragraph, the upper flux guides 251 may be left out entirely. An etch stop 283 and dielectric layer 285 are deposited and trenches 288 are etched. Permeable magnetic material may be deposited and sputtered in these trenches 288, and then they are filled with a metal, for example, copper, and CMP polished. The structure is then passivated. A metal layer, preferably Al, below the dielectric 202 may be patterned into electrically conductive lines which connect with a metal layer (preferably Al) spaced above the metal 292 by a dielectric layer (not shown) and also patterned into electrically conductive lines for imposing a self test field upon the sensor.

Figure 14:
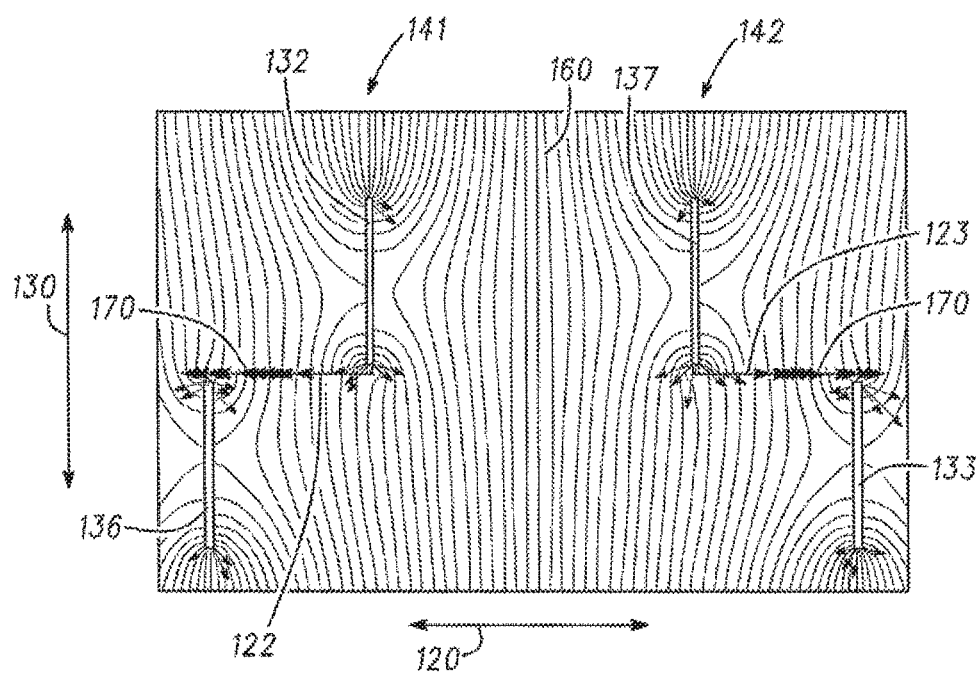
FIG. 14 is a view of flux lines as calculated by finite element simulation of two of the four Z-axis sensors of FIG. 9.

FIG. 14 is a view of flux lines as calculated by finite element simulation of sensor devices 141, 142 of FIG. 1 with a magnetic field in the Z direction 130 imparted upon the devices. Finite Element Method (FEM) modeling shows the resultant magnetic flux lines 160, exhibiting a component in the plane of the sensor. Sensor device 141 is represented by flux guides 132 and 136 on opposed ends of the sensing element 122. Sensor device 142 is represented by flux guides 133 and 137 on opposed ends of the sensing element 123. Stated otherwise, sensing element 122 extends from flux guides 132 and 136, and sensing element 123 extends from flux guides 133 and 137. The component of an external magnetic field along the Z axis 130 interacts with the flux guides 132, 136, 133, and 137 to produce an asymmetric response in the sensing elements 122, 123 along the X-axis 120 as indicated by the arrows 170. In this manner, for an applied field in the Z direction 130 directed towards the bottom of the page, the magnetization of sense element 122 rotates away from the pinning direction (and to higher resistance) of the reference layer 126, while the magnetization of sense element 123 rotates towards the pinning direction (and to lower resistance) of reference layer 127. For a field in the X direction 120, both elements 122, 123 show induced magnetization in the same direction (towards higher or lower resistance). Therefore, by wiring MTJ elements 141, 142 in a Wheatstone bridge for differential measurement and subtracting the resistances of MTJ devices 141, 142, the X field response is eliminated and twice the Z field response is measured.

Figure 15:
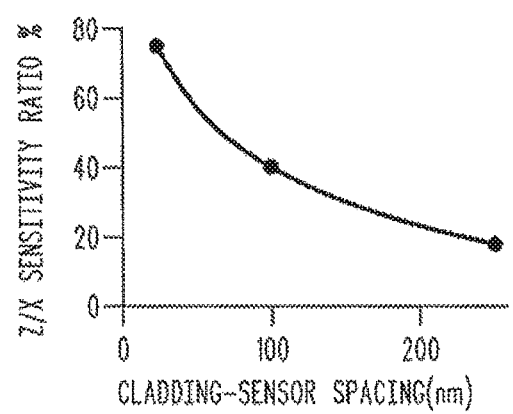
FIG. 15 is a graph illustrating the Z sensitivity expressed as a percentage of the X sensitivity for a single (not differentially wired) MTJ sense element as a function of the cladding to sensor spacing.

FIG. 15 is a graph showing the Z/X sensitivity ratio versus the cladding/sensor spacing for a 25 nm wide, 500 nm tall vertical segments placed above and below the sense element. The Z/X sensitivity ratio increases, to about 75 percent, as the cladding is brought to 25 nanometers of distance. Additional factors may be gained through cross sectional changes such as those highlighted above, or through aspect ratio improvements in the flux guide, for example, making the guide taller will linearly increase the Z/X sensitivity ratio. Therefore, it is important to bring the flux guide as close as possible to the sense element, and increase its height as much as is possible without adversely impacting the magnetic microstructure.

A manner to increase the flux guide 214 height in an exemplary embodiment is to etch the trench 208 (FIG. 2) in dielectric 206, deposit the permeable magnetic material 212, fill the trenches with copper, and then perform a chemical metal polish to expose the surface. This same process is repeated again on top of the filled trenches 208 so that the flux guides from the two (or more) repeats of this process flow directly align vertically. An optional dielectric spacer layer (not shown) may be deposited between the multiple flux guides 302, 304 to magnetically decouple them from one another so as to reduce the propensity for magnetic domains to form at the microstructure formed at the interface between the two vertically aligned flux guides 302, 304. This process may also be utilized for the flux guides 258.

Furthermore, vias may be formed below the dielectric 204 and covered with magnetically permeable material 212 and filled at the same time as the sides 216 of the first plurality of trenches 208. This process forms taller flux guides where the sides of the vias are aligned with the sides of the first plurality of trenches 216.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method of manufacturing an integrated magneto-resistive sensor, the method comprising:
depositing a first insulating material on or over a substrate;
forming a first plurality of flux guides on or in the first insulating material;
forming a first plurality of magneto-resistive sensor elements on or over the first insulating material, wherein at least one magneto-resistive sensor element of the first plurality of magneto-resistive sensor elements is associated with at least one flux guide of the first plurality of flux guides, and wherein the at least one magneto-resistive sensor element is offset from the at least one flux guide of the first plurality of flux guides; and
forming first conductors to electrically connect the first plurality of magneto-resistive sensor elements,
wherein the at least one magneto-resistive sensor element is formed above the at least one flux guide of the first plurality of flux guides; depositing a second insulating material on or over the first plurality of magneto-resistive sensor elements; and forming a second plurality of flux guides on or over the second insulating material, wherein at least one flux guide of the second plurality of flux guides is disposed above the at least one magneto-resistive sensor element.

2. The method of claim 1, wherein:
forming first conductors to electrically connect the first plurality of magneto-resistive sensor elements includes forming a first circuit by electrically connecting the magneto-resistive sensor elements of the first plurality of magneto-resistive sensor elements.

3. The method of claim 2, wherein the first circuit is a bridge circuit, and wherein the method further includes:
connecting the bridge circuit to a voltage source.

4. The method of claim 1, wherein forming the first plurality of magneto-resistive sensor elements includes electrically connecting the first plurality of magneto-resistive sensor elements to form a first bridge circuit.

5. The method of claim 1, wherein the formed first conductors electrically connect the first plurality of magneto-resistive sensor elements to form a first circuit.

6. The method of claim 5, wherein the first circuit is a bridge circuit.

7. The method of claim 1, wherein the at least one flux guide of the first plurality of flux guides includes at least one of nickel, a nickel alloy, iron, an iron alloy, cobalt, or a cobalt alloy.

8. The method of claim 1, wherein the magneto-resistive sensor elements are magnetic tunnel junction sensor elements.

9. The method of claim 1, further comprising:
forming a second plurality of magneto-resistive sensor elements; and
forming second conductors to electrically connect the second plurality of magneto-resistive sensor elements.

10. The method of claim 1, further comprising:
connecting the first plurality of magneto-resistive sensor elements in a circuit such that, in operation, the circuit is configured to subtract a resistance of the least one magneto-resistive sensor element from a resistance of another magneto-resistive sensor element of the first plurality of magneto-resistive sensor elements.

11. The method of claim 1, further comprising:
forming a first bridge circuit by electrically connecting the magneto-resistive sensor elements of the first plurality of magneto-resistive sensor elements;
forming a second plurality of magneto-resistive sensor elements; and
forming a second bridge circuit by electrically connecting the magneto-resistive sensor elements of the second plurality of magneto-resistive sensor elements.

12. The method of claim 1, wherein forming the first plurality of magneto-resistive sensor elements includes:
forming a reference layer,
forming a sensing layer, and
forming an intermediate layer between the reference and sensing layers.

13. The method of claim 1, wherein forming the first plurality of magneto-resistive sensor elements includes:
forming a reference layer,
forming a sensing layer, and
forming an intermediate layer between the reference and sensing layers, wherein the intermediate layer includes an insulating material.

14. The method of claim 1, wherein the sensing layer includes a magnetization direction configured to change when exposed to an external magnetic field.

15. A method of manufacturing an integrated magneto-resistive sensor, the method comprising:
depositing a first insulating material on or over a substrate;
forming a first plurality of flux guides on or in the first insulating material, wherein the flux guides comprise a magnetic material, and wherein forming the first plurality of flux guides on or in the first insulating material includes forming trenches in the first insulating material, with each trench including at least two side walls, and depositing magnetic material in the trenches;
forming a plurality of magneto-resistive sensor elements on or over the first insulating material, wherein forming the plurality of magneto-resistive sensor elements includes:
forming a reference layer,
forming a sensing layer, and
forming an intermediate layer between the reference layer and the sensing layer; and
forming conductors to (i) electrically interconnect a first subset of the magneto-resistive sensor elements into a first bridge circuit and (ii) electrically interconnect a second subset of the magneto-resistive sensor elements into a second bridge circuit,
wherein each magneto-resistive sensor element of the first subset of the magneto-resistive sensor elements is adjacent to and offset from an associated flux guide of the first plurality of flux guides.

16. The method of claim 15, wherein forming conductors to electrically interconnect a first subset of the magneto-resistive sensor elements into a first bridge circuit further includes forming conductors to electrically interconnect the first subset of the magneto-resistive sensor elements into the first bridge circuit having (i) input conductors configured for connection to a voltage source and (ii) output conductors configured for connection to a detection circuit.

17. The method of claim 15, wherein the magnetic material of the flux guides comprises one or more of nickel, a nickel alloy, iron, an iron alloy, cobalt, or a cobalt alloy.

18. The method of claim 15, wherein the intermediate layer of each magneto-resistive sensor element is a dielectric material.

19. The method of claim 15, further comprising:
depositing a second insulating material on or over the plurality of magneto-resistive sensor elements; and forming a second plurality of flux guides on or over the second insulating material.

20. A method of manufacturing an integrated magneto-resistive sensor, the method comprising:

depositing a first insulating material on or over a substrate;

forming a first plurality of flux guides on or in the first insulating material;

forming a first plurality of magneto-resistive sensor elements on or over the first insulating material, wherein at least one magneto-resistive sensor element of the first plurality of magneto-resistive sensor elements is associated with at least one flux guide of the first plurality of flux guides, and wherein the at least one magneto-resistive sensor element is offset from the at least one flux guide of the first plurality of flux guides;

forming first conductors to electrically connect the first plurality of magneto-resistive sensor elements;

depositing a second insulating material on or over the first plurality of magneto-resistive sensor elements; and forming a second plurality of flux guides on or over the second insulating material.

21. The method of claim 20, wherein at least one flux guide of the second plurality of flux guides is disposed above the at least one magneto-resistive sensor element.

22. The method of claim 20, further comprising:

connecting the first plurality of magneto-resistive sensor elements in a circuit such that, in operation, the circuit is configured to subtract a resistance of the least one magneto-resistive sensor element from a resistance of another magneto-resistive sensor element of the first plurality of magneto-resistive sensor elements.

* * * * *